United States Patent [19]

Schlangenotto et al.

[11] Patent Number: 5,063,428
[45] Date of Patent: Nov. 5, 1991

[54] SEMICONDUCTOR ELEMENT HAVING A P-ZONE ON THE ANODE SIDE AND AN ADJACENT, WEAKLY DOPED N-BASE ZONE

[75] Inventors: Heinrich Schlangenotto, Neu-Isenburg; Karl H. Sommer, Warstein, both of Fed. Rep. of Germany

[73] Assignee: eupec Europäische Gesellschaft für Leistungshalbleiter mbH & Co. KG, Warstein-Belecke, Fed. Rep. of Germany

[21] Appl. No.: 210,517

[22] PCT Filed: Sep. 25, 1987

[86] PCT No.: PCT/EP87/00544
§ 371 Date: Jun. 10, 1988
§ 102(e) Date: Jun. 10, 1988

[87] PCT Pub. No.: WO88/02555
PCT Pub. Date: Apr. 7, 1988

[30] Foreign Application Priority Data

Sep. 30, 1986 [DE] Fed. Rep. of Germany ....... 3633161

[51] Int. Cl.$^5$ ............... H01L 29/74; H01L 29/06; H01L 29/88; H01L 27/02
[52] U.S. Cl. ...................... 357/38; 357/20; 357/12; 357/46
[58] Field of Search ............ 357/20, 38, 86, 89, 357/90, 56, 12

[56] References Cited

U.S. PATENT DOCUMENTS

| | | | |
|---|---|---|---|
| 4,117,507 | 9/1978 | Pacor | 357/86 |
| 4,146,906 | 3/1979 | Miyata et al. | 357/90 |
| 4,587,547 | 5/1986 | Amemiya et al. | 357/89 |

FOREIGN PATENT DOCUMENTS

| | | |
|---|---|---|
| A135733 | 4/1985 | European Pat. Off. . |
| A157207 | 9/1985 | European Pat. Off. . |
| 52-31675 | 3/1977 | Japan ............ 357/90 |
| 5645081 | 4/1981 | Japan . |
| 54120250 | 4/1981 | Japan . |
| 58-115871 | 7/1983 | Japan . |
| 61-39575 | 2/1986 | Japan . |
| 60141401 | 2/1986 | Japan . |

OTHER PUBLICATIONS

"High Speed Low-Loss P-N Diode Having a Channel Structure", Shimizu et al., IEEE Transactions on Electron Devices, vol. ED-31, No. 9, Sep. 1984.
"Schnelle Diode", Neues Aus der Technik, vol. 15, #3, Jun. 15, 1981, p. 1.

Primary Examiner—Rolf Hille
Assistant Examiner—Mahshid Saadat
Attorney, Agent, or Firm—Spencer & Frank

[57] ABSTRACT

A semiconductor element having a p-zone on the anode side and an adjacent weakly doped n-zone which forms a blocking pn-junction with the p-zone, particularly a fast rectifier diode and a fast thyristor. To realize improved recovery behavior during commutation and good forward conduction and blocking characteristics in such components, the semiconductor element is configured in such a manner that the p-zone on the anode side includes an electron sink formed by a pn-junction formed of this zone and the adjacent n-zone; moreover, the thickness and the doping concentration of the region of the anode-side p-zone between the electron sink (S) and the pn-junction are selected in such a manner that the region of high injected charge carrier concentration under forward load extends close to the electron sink while, under a forward blocking load, the space charge zone in the p-zone does not extend to the electron sink.

20 Claims, 9 Drawing Sheets

SEMICONDUCTOR ELEMENT HAVING A P-ZONE ON THE ANODE SIDE AND AN ADJACENT, WEAKLY DOPED N-BASE ZONE

BACKGROUND OF THE INVENTION

The invention relates to a semiconductor element having a weakly doped continuous interior p-zone which is provided on its surface with an ohmic contact layer and which is adjacent to a weakly doped n-base zone adjacent to which is arranged a highly doped n+-zone.

Power rectifier diodes have a p+nn+-zone structure, i.e. they are composed of two highly doped zones of p or n-type conductivity which lie adjacent to the surface of the semiconductor disc and of a weakly doped zone, generally of n-type conductivity, disposed therebetween. In addition to a sufficiently low forward voltage and a sufficiently low reverse current, fast rectifier diodes must meet the requirement that, during commutation from the forward state, the reverse current peak and its holding time must be small and, in particular, after the reverse current maximum the reverse current must drop gradually (soft recovery behavior). A known means to realize this to a certain extent resides in the reduction of charge carrier lifetime by means of recombination centers, such as gold, platinum or by means of defects produced by electron, gamma or proton irradiation.

One drawback of this method is that the reverse current increases in proportion to the recombination center density and may become too high at the particularly effective recombination levels near the center of the band gap. This effect is very annoying at higher temperatures in connection with gold which, due to its otherwise favorable characteristics, is employed most frequently; it limits the permissible gold concentration and thus the degree of improvement of the recovery behavior.

Moreover, under consideration of the forward voltage, the recombination center density must not be selected too high, i.e. the charge carrier lifetime must not be selected too short. If the ratio of base thickness/$\sqrt{D\tau}$ (where D is the ambipolar diffusion constant, $\tau$ the charge carrier lifetime at high injection) becomes greater than 2, the forward voltage increases exponentially with $N_{Rec} \sim 1/\tau$ and becomes too high. With $\tau$, the stored charge, which is important for the recovery behavior, is also limited downwardly. An additional limitation results from the fact that, in order to avoid too much compensation, the recombination center concentration must clearly lie below the common conductivity doping of the n-base zone which, in turn, is determined by the desired blocking behavior. If this condition is not met, the application of a current pulse will initially produce dynamic voltage peaks which are too high and the forward recovery time—after which the forward voltage approaches the stationary value to within 10% of the initial excess—becomes too long. This also results in a lower limit for the charge carrier lifetime to be set, below which it must not fall. It has been found that this limitation is more drastic in many cases than that set by the stationary forward behavior.

The local distribution of the recombination centers is generally substantially predetermined by the respective technology, i.e. cannot simply be selected on the basis of optimum rectifier behavior. Only with the proton irradiation method can very favorable center distributions be realized. However, proton irradiation is an expensive procedure which has so far not been used in the manufacture of semiconductors. The other irradiation methods also have the drawback that it is generally not possible to us them to set the charge carrier lifetime in the manufacturing plants themselves.

To improve the recovery behavior of rectifier diodes, European Patent No. 0,090,722 discloses a semiconductor structure in which an n-zone of average doping concentration which lies in a range between $10^{14}$ and $10^{16}/cm^3$ is disposed between the weakly doped n-base zone and the highly doped n+-region. A considerable amount of engineering expenditures are required for the production of this intermediate zone since this zone must be produced in the starting silicon by epitaxial growth or must be approximated by additional diffusion steps. In particular, the thus realized improvement of the diode characteristics is only slight because, with the sudden rise in voltage at the time of the reverse current peak, the build-up of the space charge zone is determined primarily by the free holes in the structure flowing toward the anode and these free holes considerably increase the positive space charge. Thus, upon reaching the reverse current peak, the space charge zone does not advance to the zone of average doping concentration in a short time so that this zone is able to influence the recovery behavior only after the reverse current has become small.

Additionally, a pnn+-rectifier diode has become known (IEEE Trans. Electron Dev. ED-31, 1984, page 1314) in which the doping concentration $\rho$ and the thickness w of the p-zone on the anode side is small in laterally small channel regions, e.g. $\rho = 5 \times 10^{15}/cm^3$ and w = 1 $\mu$m, but considerably larger in the other surface regions, e.g. $\rho = 4 \times 10^{18}/cm^3$ and w = 5 $\mu$m. The lateral expanse of the channel regions lies in an order of magnitude of 2 $\mu$m. As a result, the p-zone regions of low doping concentration and thickness have a low concentration of injected charge carriers on the p-side of the n-base zone during forward operation and thus the recovery behavior is good. Under a forward blocking load, the channel regions are statically shielded so that the space charge zone does not penetrate to the surface in spite of the low doping concentration and thickness of the p-zone in these regions. One drawback of this structure is that in this way, blocking capabilities up to only about 150 V can be realized and the structure is not suitable for high voltages also because the forward voltage then comes too high. Another drawback is that individual deviations and faults in the lateral p-zone structure may result in a substantial loss of blocking capability so that the number of rejects of large-area diodes of this type becomes too large for economic use.

In addition to a short recovery period, fast thyristors must also meet the requirement that, upon commutation from the forward conducting state, the reverse current peak and the reverse current integral must be small. Similarly to the situation described above for rectifier diodes, this requirement is realized only insufficiently in prior art thyristors by doping them with recombination centers since the use of such thyristors is limited due to the secondary requirement for sufficient forward conduction characteristics and a sufficiently low reverse current.

SUMMARY OF THE INVENTION

It is the object of the invention to provide a semiconductor element having a p-zone on the anode side and an adjacent weakly doped n-zone which combines improved recovery behavior upon commutation with good forward conduction characteristics and a low reverse current and can be easily manufactured industrially for a broad range of currents and voltages.

In accordance with the present invention, the above objects are achieved by providing a semiconductor component having a weakly doped continuous interior p-zone which is provided on its surface with an ohmic contact layer and which is adjacent to a weakly doped n-base zone adjacent to which is arranged a highly doped n+-zone, and wherein highly doped p+-surface zones are arranged entirely within partial regions of the weakly doped p-zone.

Further features of the invention are set forth in the claims.

The advantages realized by the invention are that, in the semiconductor element, the reverse current peak is greatly reduced and the drop in reverse current after the maximum is a flat curve. The reverse current is reduced so that the semiconductor element ca be used for higher operating temperatures. Moreover, the semiconductor element can be manufactured in large quantities and with large surfaces without costly irradiation procedures and without the masking accuracy required for field effect components.

The invention will be described in greater detail below with reference to embodiments which are illustrated schematically in the drawing figures.

DETAILED DESCRIPTION OF THE PREFERRED EMBODIMENTS

Figure 1B:
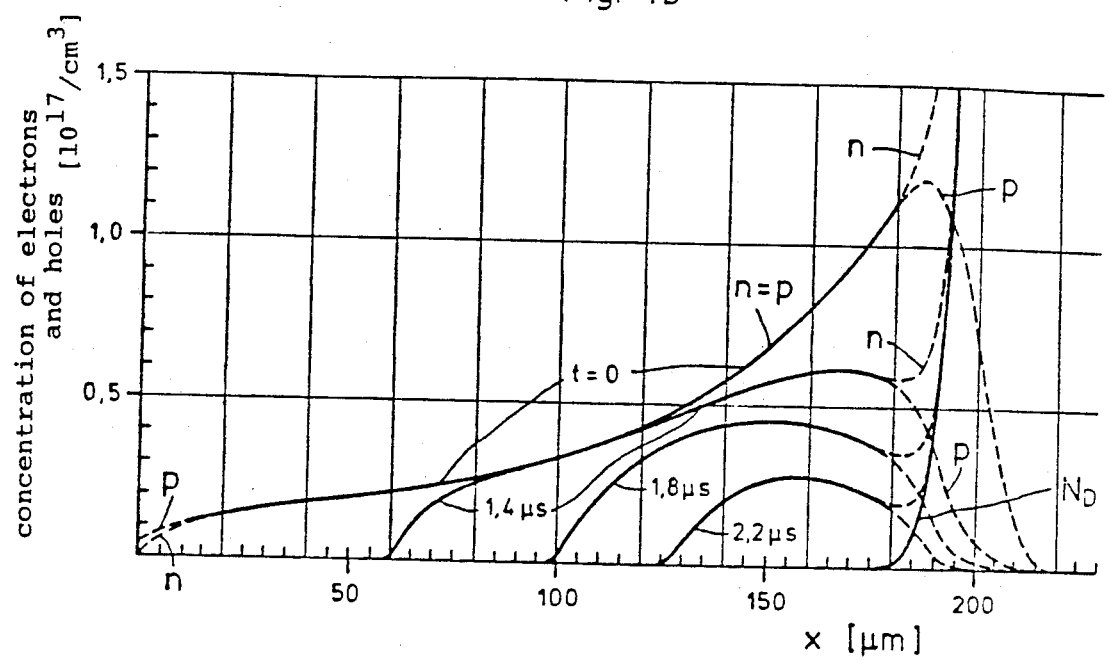
FIG. 1b shows the course of the charge carrier distribution in the zones of that structure.
Figure 1A:
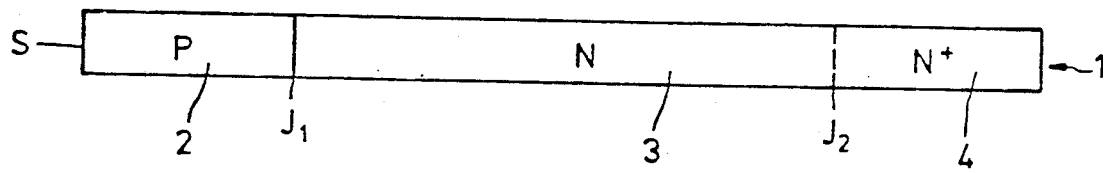
FIG. 1a shows a basic rectifier diode structure according to the invention.

FIG. 1a shows a rectifier diode 1 including an electron sink S in the p-zone 2 to improve recovery behavior. The electron sink may either be formed by the surface or, as will be described below, by n-zones in p-zone 2, in which case p-zone 2 is only so weakly doped in front of electron sink S that, under forward load, the region of high injections extends close to electron sink S. However, doping in front of the electron sink is strong enough to prevent the space charge zone from extending to the electron sink under a forward blocking load. As not shown in further detail, p-zone 2, in order to be ohmically contactable on the surface, is provided, at least in partial regions, with a zone of high doping concentration. Toward the interior, p-zone 2 is followed by a weakly doped n-base zone 3 and the latter is followed by a highly doped n+-zone 4.

In the diagram of FIG. 1b, the electron and hole distributions in the diode according to FIG. 1a are shown for forward operation (t=0) and at various points in time after the beginning of commutation. In the region of high injection with negligible doping concentration, the electron concentration n and the hole concentration p are identical. The curves for n and p diverge greatly only with increasing doping concentration $N_D$ at nn+-junction $J_2$.

Figure 2:
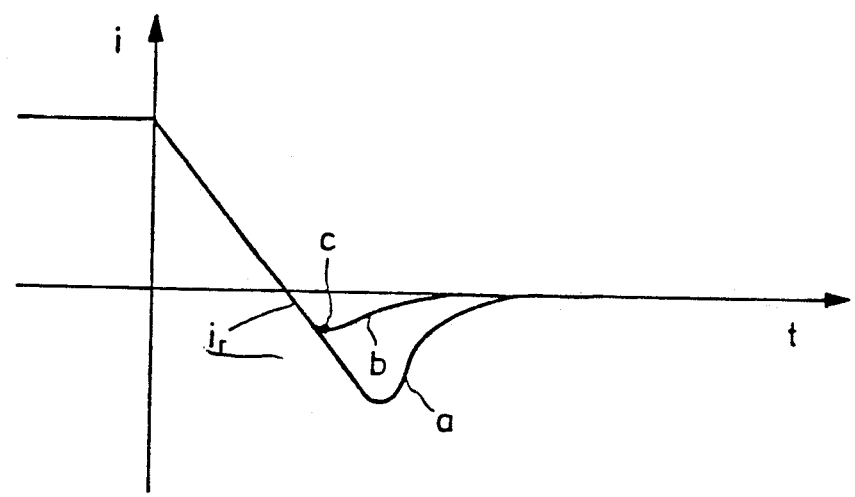
FIG. 2 is a diagram showing the course over time of the reverse current in a rectifier diode according to the invention and in a rectifier diode according to the prior art.

As can be seen in the diagram, the electron sink S provided in p-zone 2 produces a great drop in the concentration of the injected charge carriers under forward load on the p-side in the region of pn-junction $J_1$. The charge carrier concentration at pn-junction $J_1$ is, for example, only about $2 \times 10^{16}/cm^3$, but at nn+-junction $J_2$ it is more than $1 \times 10^{17}/cm^3$. Due to this asymmetrical charge carrier distribution, pn-junction $J_1$ is quickly cleared of charge carriers during the commutation process, as indicated by the charge carrier distributions for t=1.4 µs, 1.8 µs and 2.2 µs after the start of commutation. Already at t=1.4 µs, the concentration of injected charge carriers in the closer vicinity of pn-junction $J_1$ equals zero so that a space charge zone and a corresponding reverse voltage build up which are directed against the external voltage. Since the reverse current $i_r$ begins to drop with the beginning of the intake of reverse voltage, the time until the reverse current peak is reached is short which also results in a low reverse current peak itself during the conventional commutation with constant di/dt. However, in spite of the already high voltage across the diode, much charge is still stored in the n-base region in the vicinity of n-zone 4, as is also indicated in FIG. 1. Therefore, the current is unable to break off sharply so that the distinct soft recovery behavior shown in FIG. 2 results for the rectifier diode. In FIG. 2, curve a represents the time curve for the reverse current $i_r$ of a rectifier diode according to the prior art while curve b represents the time curve for the reverse current $i_r$ of a rectifier diode according to the invention. As can be seen, the reverse current peak c in the rectifier diode according to the invention is greatly reduced and the drop in the reverse current $i_r$ after its maximum is substantially flatter.

The statements above in reference to the rectifier diode according to the invention essentially also apply for the commutation of a thyristor having a similar charge carrier distribution during forward operation.

Figure 3:
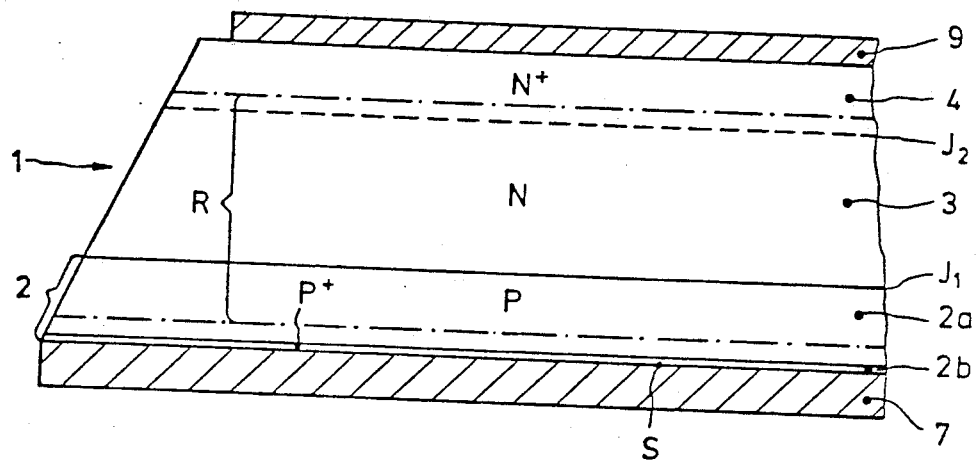
FIG. 3 shows one configuration of the rectifier diode according to the invention.

In the configuration of the rectifier diode according to FIG. 3, p-zone 2 is composed of a thick, weakly doped interior p-type partial zone 2a and a thin, highly doped p+-surface zone 2b with which the semiconductor disc is alloyed or soldered onto a substrate 7. The p-type partial zone 2a is followed by a weakly doped n-base zone 3 and this is followed by a highly doped n+-zone 4 which is provided with an ohmic contacting layer 9 on its surface. Pn-junction $J_1$ between p-type partial zone 2a and n-base zone 3 takes on the reverse voltage. To passivate the surface, the rectifier diode is provided with a bevel grind.

Figure 4:
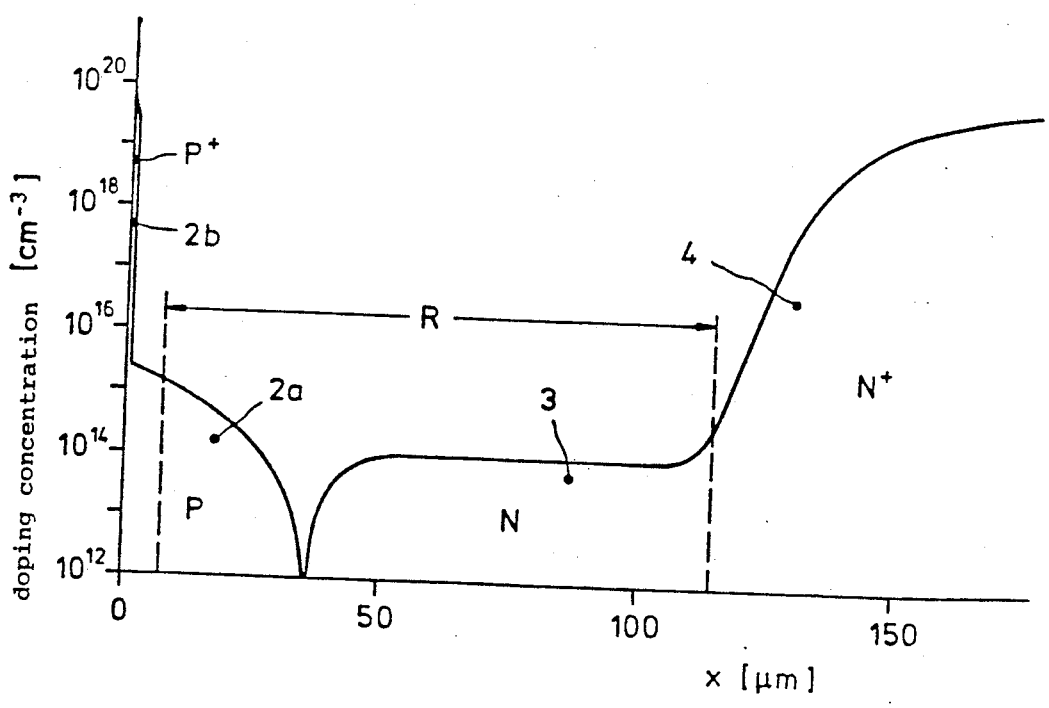
FIG. 4 is a doping profile for the zone structure of a rectifier diode configured according to FIG. 3.

As can be seen in the doping profile shown in FIG. 4 for the rectifier diode of FIG. 3, the weakly doped region 2a of p-zone 2 has only a surface concentration between $1 \times 10^{15}/cm^3$ and $1 \times 10^{16}/cm^3$; its thickness is, for example, 40 μm. Under forward blocking load, space charge zone R on the p-side expands only within this zone, i.e. does not extend to the surface even under maximum forward blocking load. As is known, high blocking capability is realized by this generally diffused-in zone. However, in forward operation, beginning already at low current densities, e.g., 5 A/cm² and upwards, the region of average to high injected charge carrier concentration extends closely to the surface so that this surface acts as an effective electron sink. The thin p+-surface zone 2b serves only to provide ohmic contact and has a doping concentration sufficient for this purpose, generally greater than $3 \times 10^{17}/cm^3$. The thickness of surface zone 2b is selected to be so small that the electrons coming from n+-zone 4 are prevented only to a slight degree from flowing to the electron sink at the surface where they recombine or move into the metal by way of a tunneling process. Advantageously, the thickness is selected to be less than 2 μm, for example 0.2 μm. As described in connection with FIG. 1, this causes the charge carrier concentration at the p-side to be reduced considerably at currents above, for example, 5 A/cm². The result is the desired improvement in recovery behavior. Advantageously, the rectifier diode is additionally doped with recombination centers to the extent permitted by the forward voltage which is increased by the recombination centers as well as by the configuration of p-zone 2 according to the invention. Since, for this reason, the recombination center density is lower than in comparable prior art rectifier diodes, the reverse current is also correspondingly lower.

The condition that space charge zone R still extends within the weakly doped p-type partial zone 2a even under maximum forward blocking load and, on the other hand, the region of average to high injection extends close to the surface under a forward load, can be expressed with the aid of the integral doping $N_{int} = \int N dx$, i.e. the area occupation with doping atoms, of p-type partial zone 2a. In order to ensure blocking capability, $N_{int}$ is selected to be greater than about $1.3 \times 10^{12}/cm^2$; in order for the surface to form an effective electron sink if the diode is polarized in the forward direction, $N_{int}$ is advantageously less than about $1 \times 10^{13}/cm^2$. Approximately equivalent is thus the following condition for the sheet resistance R of p-type partial zone 2a:

$$1.5\ K\Omega \lesssim R_\square \lesssim 10\ K\Omega$$

To realize a good yield for components having a higher blocking capability it is further of advantage to select the thickness of p-type partial zone 2a to be greater than 5 μm. For reasons connected with the passivation and the drop in forward voltage, the thickness, on the other hand, is advantageously selected to be less than 70 μm. Under consideration of the conditions for integral doping and sheet resistance, respectively, the maximum doping concentration of p-type partial zone 2a is advisably selected to be between $1 \times 10^{15}/cm^3$ and $2 \times 10^{16}/cm^3$.

It has been found that rectifier diodes according to FIGS. 3 and 4 also meet the requirements with respect to forward conduction data up to a blocking capability of about 1000 V and the appropriate doping with recombination centers, and thus as a whole constitute a significant improvement over the prior art. If n-base zone 3 is designed for higher reverse voltages, the forward voltage will still stay within permissible limits for current loads up to about 200 A/cm² as encountered in operation, if the n-base zone is not too thick, but with high current densities as they occur in the case of excess current (case of shorting) the forward voltage increases to an unexpectedly high degree so that the excess current carrying capacity is reduced considerably. The reasons for this will be explained with reference to FIG. 5 in which the hole distributions in a rectifier diode according to FIGS. 3 and 4 are plotted for various forward current densities. The doping curve is shown in dashed lines. For an operating current density of 200 A/cm², the illustrated asymmetrical hole distribution results which, in the region of weak doping, coincides with the electron distribution. With increasing current, the charge carrier concentration initially increases some more, as evidenced by a comparison with the curve for 1000 A/cm². With further increasing current, the region of reduced charge carrier concentration at the p-side of n-base zone 3 continues to expand into the n+-side half of n-base zone 3, as evidenced by the curve for 5000 A/cm². Since the stored charge in this diode no longer increases, the voltage increases considerably with the current and thus its excess current carrying capacity is reduced.

Raising the surface concentration of p-zone 2a (FIGS. 3, 4) results in a corresponding increase in the charge carrier concentration at high current densities and thus in an improvement of excess current carrying capacity. Increasing the thickness of highly doped surface zone 2b can also produce a given excess current carrying capacity. However, both measures adversely affect the recovery behavior since the effectiveness of the electron sink at the surface and thus the asymmetry of the charge carrier distribution at operating currents is reduced. Nevertheless, a better recovery behavior at a given permissible excess current than with prior art rectifier diodes is realized in this way with the rectifier structure according to FIGS. 3 and 4.

A further improvement is realized in that the area of electron sink S is arranged so as to be effective only in partial regions of p-zone 2 while the injection capability of p-zone 2 is high in the intermediate regions. Such an arrangement is shown in the rectifier structure of FIG. 6. The n+-zone 4 with which the semiconductor disc is conductively attached to a substrate 7 is followed by a weakly doped n-base zone 3 which is in turn followed by a p-zone 2 whose surface is provided with an ohmic contacting layer 9. In addition to the continuous, weakly doped partial zone 2a which, as in the rectifier diode according to FIG. 3, forms the blocking pn-junction $J_1$ with n-base zone 3, p-zone 2 includes, in regions B, a thin, highly doped p+-zone 2b which serves for contacting in these regions and, in partial regions C, relatively thick, highly doped p+-zones 2c which have a high emitter efficiency. In regions B, p-zone 2 has a doping curve similar to the rectifier diode according to FIGS. 3 and 4; given the doping concentration of the weakly doped partial zone 2a and the thickness of the highly doped partial zone 2b, it is not necessary to consider the excess current carrying capacity since it is realized by zones 2c.

Figure 5:
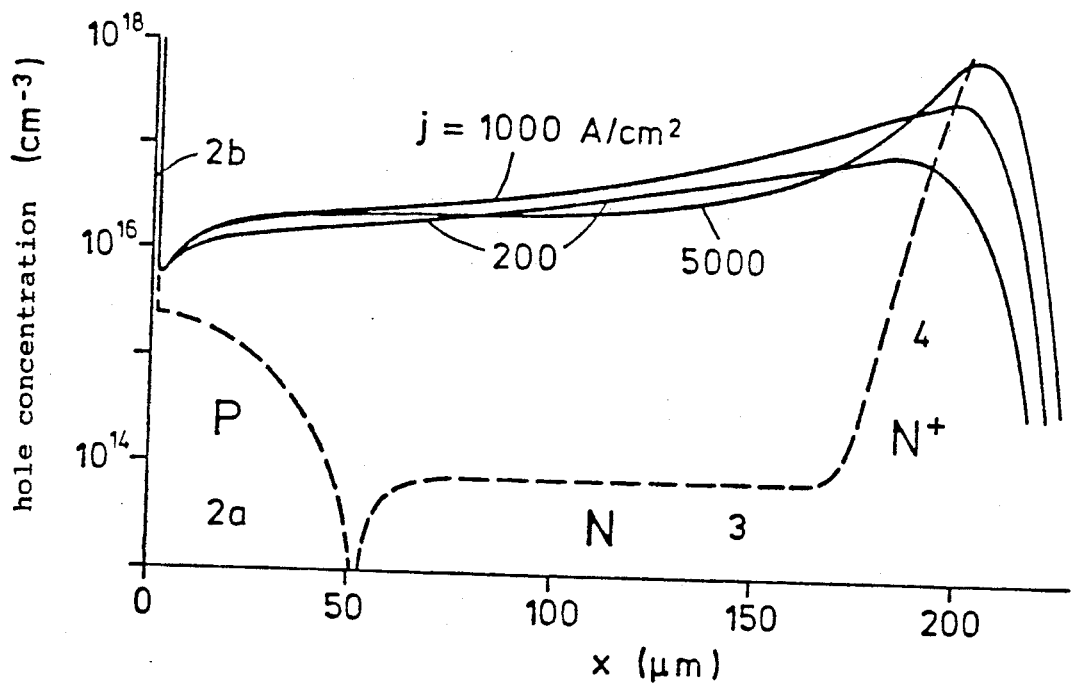
FIG. 5 shows the distribution of injected charge carriers in a rectifier diode according to FIG. 3 at different forward current densities.
Figure 6:
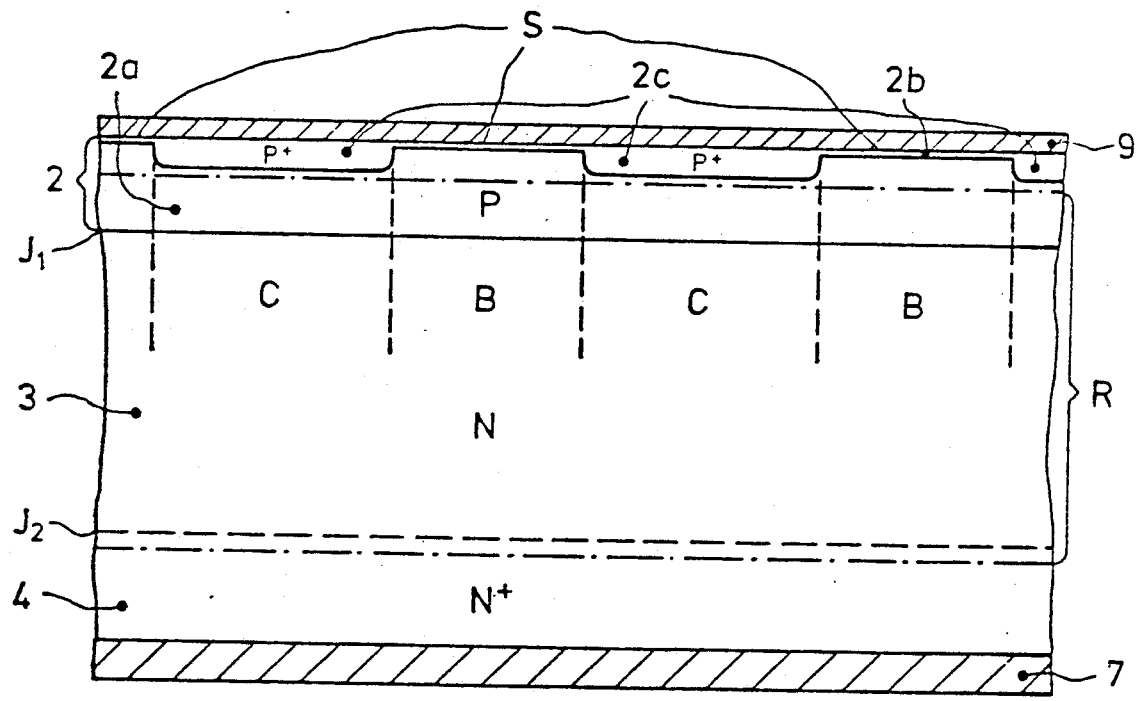
FIG. 6 shows a further configuration of a rectifier diode according to the invention with laterally alternating regions of high and low p-emitter efficiency.

Since the p-zone in regions B is weakly doped, except for the thin surface zone 2b, the region of average to high injected charge carrier concentration extends close to the surface in the forward operation, so that the latter acts as an effective electron sink in regions B. Sink S causes the laterally averaged charge carrier concentration at pn-junction $J_1$ to be greatly reduced so that the recovery behavior is significantly improved compared to prior art rectifier diodes. Compared to the rectifier diode according to FIG. 3, the highly doped p+-zones 2c result in an improvement of excess current carrying capacity because they produce an increase in the stored charge with the current while the stored charge of the rectifier diode according to FIG. 3 increases only slightly or not at all at high current densities, as is explained in connection with FIG. 5. The increase in the stored charge with the current in the rectifier diode according to FIG. 6 is augmented in that, with increasing current, the current displaces itself more and more from regions B of low p-emitter efficiency, to regions C of high p-emitter efficiency because conductance increases there. However, due to the increased current density in regions C, the stored charge and thus conductance are further increased there. In regions B, where the current density for a given total current is less than in the rectifier diode according to FIG. 3, with a homogeneous electron sink, the stored charge is reduced only slightly or not at all by the reduced current density in the case of excess current (FIG. 5). The higher stored charge in the rectifier diode according to FIG. 6, with a given total current, not only reduces the total power loss which is integrated over the area but also the local power loss in regions C of high current density so that the permissible excess current is increased.

The total complex composed of recovery and excess current characteristics is also improved compared to a homogeneous arrangement of the electron sink without well injecting p+-zones 2c since the ratio of the stored charge at normal operating currents to the stored charge in the case of excess current is smaller. This also applies for the case that the surface concentration of the weakly doped zone 2a or the thickness of highly doped zone 2b in FIGS. 3 and 4 is increased to a certain degree to realize in this way a greater excess current carrying capacity for the rectifier diode according to FIG. 3.

As not shown in detail, the semiconductor disc according to FIG. 6 may also rest on substrate 7 with its p-zone 2 while its n+-zone 4 is then provided with the contacting layer 9.

Figure 7:
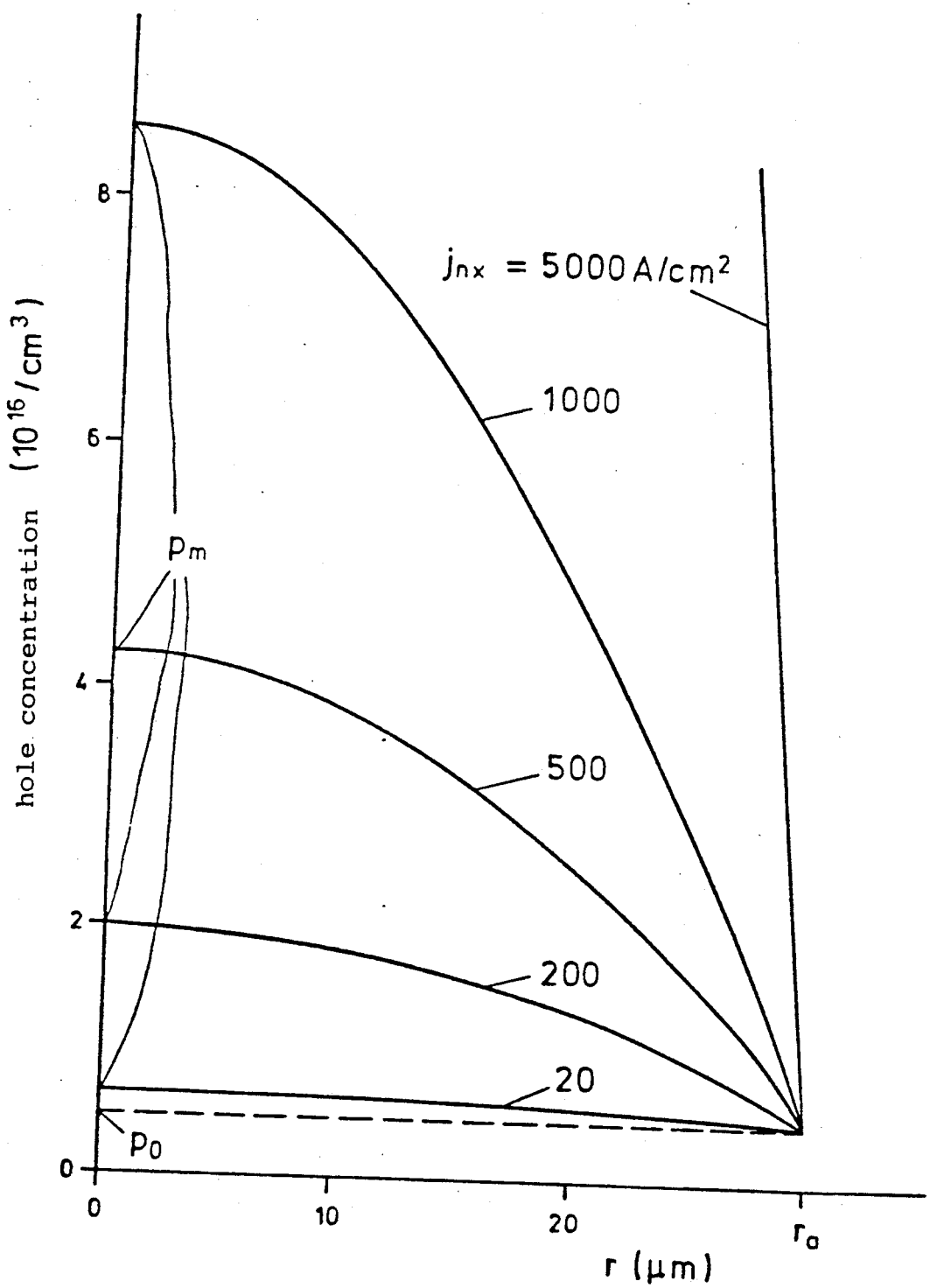
FIG. 7 shows the lateral distribution of the hole concentration in a rectifier diode according to FIG. 6 at different electron current densities.
Figure 7:
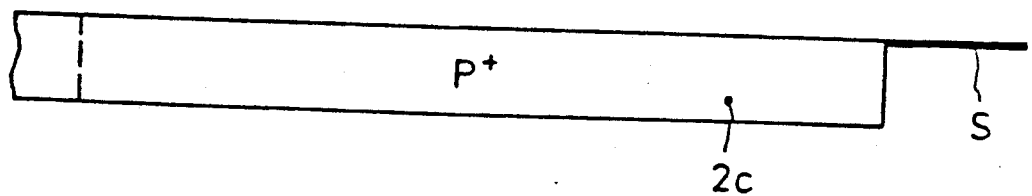

In the above comments regarding improvements realized by zones 2c, effects at the edges of these zones were not considered. Let it be assumed that the metal layer 9 holds p+p-junctions $J_3$ at almost thermal equilibrium at the edge of p+-zones 2c so that these zones will not inject along the edge. Only with increasing distance from the edge will p+p-junctions $J_3$ be increasingly polarized in the forward direction if the rectifier diode is polarized in the forward direction by electron currents flowing in p-zone 2a along junctions $J_3$ toward electron sink S. The laterally varying injection results in a local variation of the hole concentration in p-zone 2a at the boundary to a p+-zone 2c. For circular p+-zones 2c having a radius of only 30 μm, this is shown in FIG. 7 for various vertical electron current densities $j_{nx}$ in regions C at pn-junction $J_1$. The doping concentration of p-zone 2a immediately in front of p+-zone 2c is $p_0 = 5 \times 10^{15}/cm^3$ and the electron sink (surface) follows p+-zone 2c in the plane of p+p-junction $J_3$. As can be seen in this figure, the hole concentration p at the edge, if $r = r_a$, is equal to the doping concentration $p_0$ of p-zone 2a; in the center, at $r = 0$, p takes on its maximum value $p_m$. The injected hole concentration for $r < r_a$ for higher currents increases greatly with the electron current density $j_{nx}$. This applies in a similar manner also for the dependence on total current density which additionally also includes the hole current and is thus greater. Up to $j_{nx} = 200$ A/cm², the hole concentration $\bar{p}$ in zone 2a, which is averaged over the area and determines the recovery behavior has not yet increased greatly. If, for example, p+-zones 2c take up one third of the total area on the anode side, then, in the example of FIG. 7, the concentration $\bar{p}$ averaged over the total area and with $j_{nx} = 200$ A/cm² is initially greater by approximately 50% than $p_0$. However, at $j_{nx} = 1000$ A/cm² and under the same conditions, $\bar{p}$ is already greater by about 300%, at 5000 A/cm² approximately by a factor of 20. With very high current densities, the maximum value $p_m$ and also the averaged charge carrier concentration $\bar{p}$ at pn-junction $J_1$ of the hole concentration increases in the case of a single or a few large-area p+-zones 2c with overall the same percentage of area since the influence of the edges decreases with high current densities.

Figure 8:
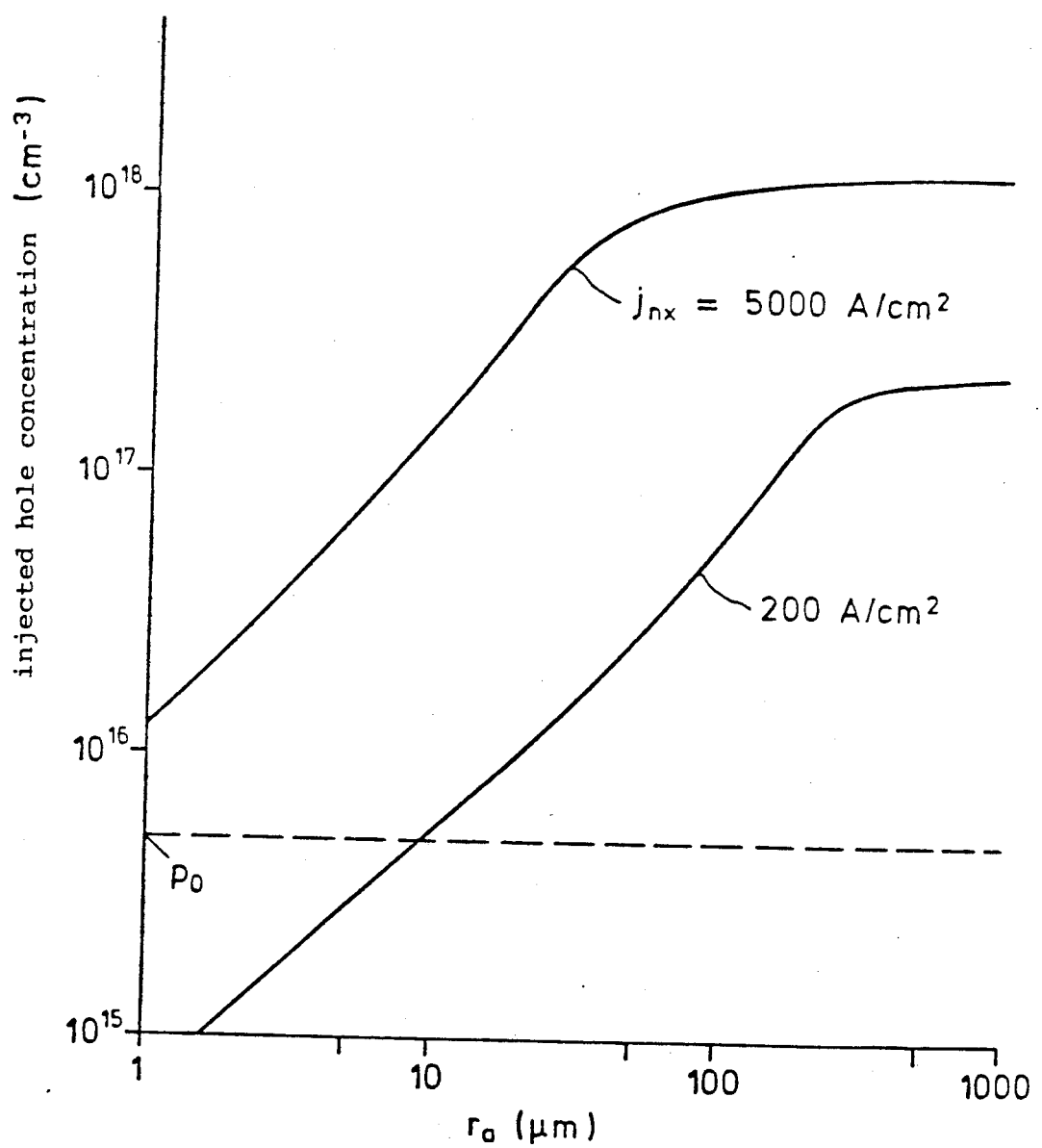
FIG. 8 shows the maximum value of the injected hole concentration as a function of the radius of the regions of high p-emitter efficiency for the rectifier diode according to FIG. 6.

The dependence of the maximum injected hole concentration $p_m - p_0$ for $r = 0$ on radius $r_a$ of p+-zones 2c is shown in FIG. 8 for two current densities $j_{nx}$ in regions C. The curve for 200 A/cm² identifies the injection capability of p+-zones 2c for operational forward current densities, while the curve for 5000 A/cm² identifies the injection of p+-zones 2c upon excess current loads. Initially $p_m - p_0$ increases considerably with $r_a$ and with a high $r_a$ it changes to the saturation value given by the volume characteristics of the p+-zones. As can be seen, the ratio of the injected hole concentration at the operating currents to the injected hole concentration under an excess current load can be reduced considerably to below the ratio of this concentration for large-area p+-zones 2c (saturation range) by selecting a small radius $r_a$. Advisably, $r_a$ is selected in such a way that the hole injection at operating currents is only as large as required for the maximum permissible forward voltage, while the hole injection at excess currents comes as closely as possible to the saturation value. If both conditions cannot be met simultaneously to the fullest extent, a compromise must be made which, depending on the intended use of the rectifier diode, may come closer to the maximum excess current carrying capacity or closer to the best possible recovery behavior. In any case, compared to the case of large-area p+-zones 2c with the same area percentage, the hole injection at operating currents can be reduced considerably without adversely affecting excess current carrying capacity. If the laterally averaged injection at excess current almost reaches the limit value, the excess current carrying capacity becomes even greater if a large number of relatively small p+-zones 2c are employed because the power losses are more uniformly distributed over the semiconductor area and thus heat dissipation is improved. Due to the greatly reduced injection of p-zone 2 at operating currents, a significantly improved recovery behavior results in spite of the high excess current carrying capacity. The described current concentration to regions C is less, the more densely the semiconductor area is penetrated by p+-zones 2c and the smaller their radius $r_a$, since transverse diffusion then results in a greater lateral compensation of charge carriers.

If, for example, $r_a$ is selected to equal 50 μm, the hole injection at operating currents is $p_m - p_0 = 2.6 \times 10^{16}/cm^3$. If, as in the above example, p+-zones 2c take up ⅓ of the total area of the rectifier diode on the anode side, this corresponds to a hole concentration $\bar{p}$, averaged over the area, of only about $4 \times 10^{15}/cm^3$. Together with a doping concentration $p_0$ at the surface of p-type partial zone 2a of, for example, $5 \times 10^{15}/cm^3$, this injection is sufficient for a sufficiently low forward voltage at operating currents with a blocking capability dimensioned up to about 1800 V, but $\bar{p}$ is still so small that a very good recovery behavior results. As can be seen in FIG. 8, with this $r_a$, the injection under excess current load still almost equals the saturation value for large areas.

Since the forward voltage increases with the thickness of n-base zone 3, i.e. also with the dimensioned blocking capacity, this must be considered when setting the average p-emitter efficiency by way of radius $r_a$ and the area percentage of p+-zones 2c in the total area. With a high blocking capability, the p-emitter efficiency at operating currents should be selected to be greater than for a low blocking capability so that the forward voltage does not become too high.

Figure 9:
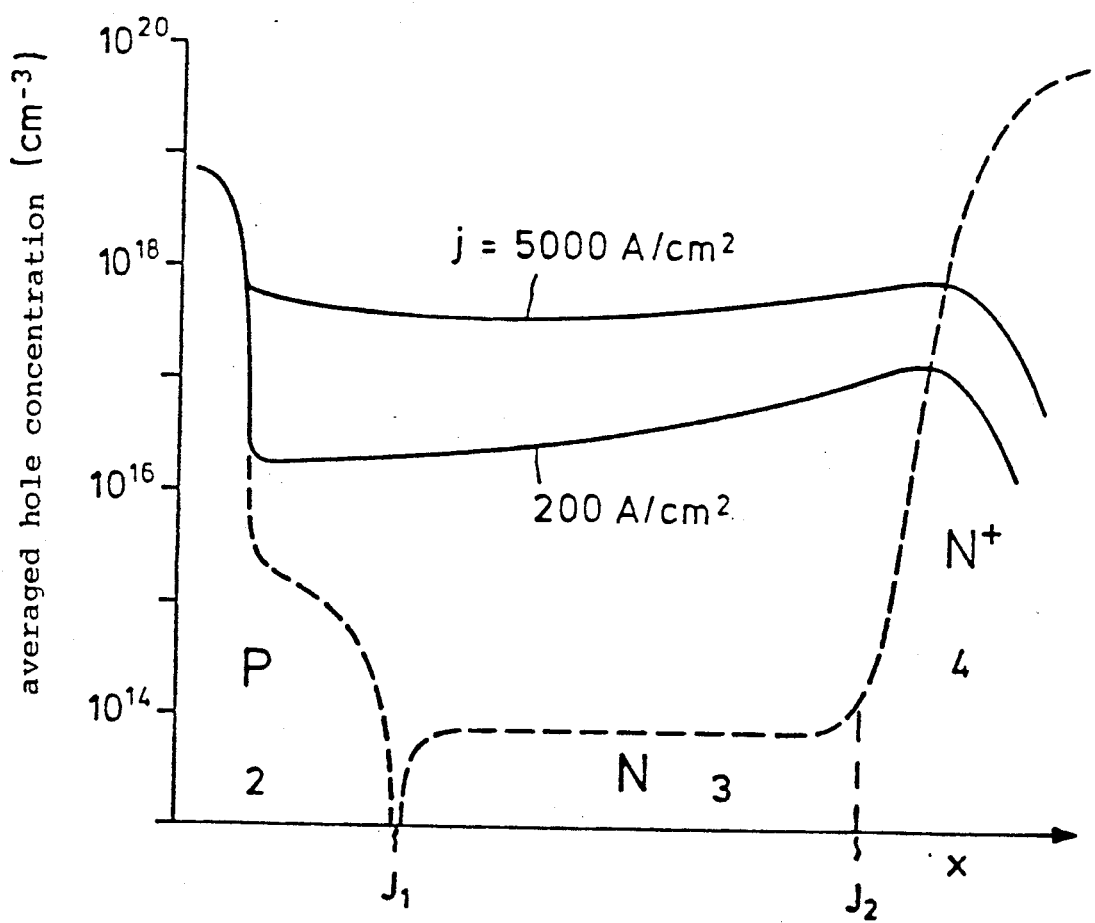
FIG. 9 shows distributions of injected charge carriers in the rectifier diode according to FIG. 6 with different forward current densities.

The basic influence of a relatively tight coverage of the semiconductor area at the anode side with p+-zones 2c on the laterally averaged injected hole concentration $\bar{p}$ in the cases of operating current and excess current is shown in FIG. 9. The lateral expansion of p+-zones 2c is here selected according to the statements made in connection with FIG. 8. At operating currents, $\bar{p}$ is considerably lower in the vicinity of pn-junction $J_1$ than at nn+-junction $J_2$, as indicated by the curve for 200 A/cm². As described above, this results in a similarly good recovery behavior as for the rectifier diode according to FIG. 3. However, with excess currents the averaged hole concentration at pn-junction $J_1$ is approximately equal to that at nn+-junction $J_2$ and, compared with the charge carrier distribution shown in FIG. 5 of the rectifier diode according to FIG. 3, it is considerably higher, as indicated by the curves for 5000 A/cm² in FIGS. 9 and 5. This results in a significantly improved excess current behavior for the rectifier diode according to FIG. 6 which has the dimensions described in connection with FIGS. 7 and 8.

Figure 10:
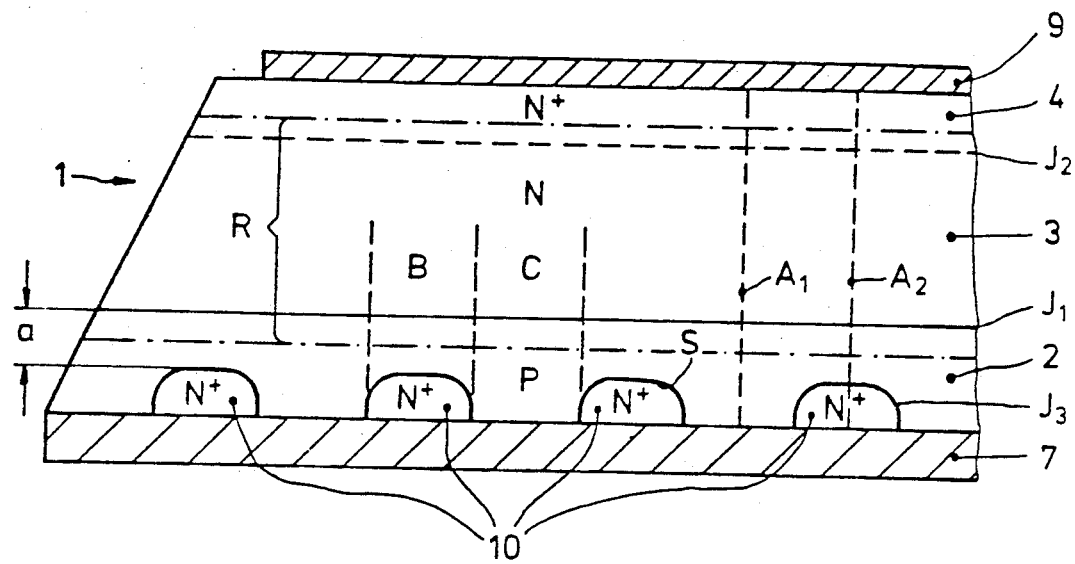
FIG. 10 shows a further configuration of the rectifier diode according to the invention.

As can be seen in FIG. 10, electron sink S may also be formed by n-conductive surface zones 10 which lie in p-zone 2 and form a pn-junction $J_3$ with it. The n-conductive surface zones 10 are configured as highly doped n+-zones. Together with p-zone 2, they are contacted at the surface by means of a metal layer 7. The thickness of n+-zones 10 is less than that of p-zone 2 which forms the continuous pn-junction $J_1$ with the weakly doped n-base zone 3 adjacent to it. The n-base zone 3 is followed by the highly doped n+-zone 4 which forms nn+-junction $J_2$ with n-base zone 3 and is provided at its surface with contacting layer 9. The thickness a and the doping concentration of the region of p-zone 2 in front of n+-zones 10 are selected to be so large that the expanse of space charge zone R under a forward blocking load does not extend up to n+-zones 10. In this way, pn-junction $J_1$ ensures the desired blocking capability for the rectifier diode. However, the thickness a and the doping concentration of the projecting region of p-zone 2 have also been selected small enough that in forward operation the region of high injection extends close to n+p-junctions $J_3$. If the diode is polarized in the forward direction, these n+p-junctions $J_3$ are polarized in the reverse direction and therefore act, together with the respectively following n+-zone 10, as a sink for the electrons. These conditions can be expressed, similarly to the manner described in conjunction with FIG. 3, by the integral net doping $N_{int} = \int Ndx$ or the sheet resistance $R_\Box$ of the region of p-zone 2 placed ahead of n+-zones 10 in regions B. In the embodiment according to FIG. 10, however, the border of the space charge zone R on the p-side—in distinction to the embodiments according to FIGS. 3 and 6—must be clearly spaced from electron sink S so that the npn-transistor formed of n+-zones 10, p-zone 2 and n-base zone 3 does not prematurely go into breakdown due to punch-through when the rectifier diode is under a forward blocking load, which will be discussed in greater detail below. Advantageously, the integral doping and the sheet resistance of p-zone 2 in regions B is selected according to the following inequalities:

$$2 \times 10^{12}/cm^2 \lesssim N_{int} \lesssim 2 \times 10^{13}/cm^2$$

$$7 k\Omega \gtrsim R_\Box \gtrsim 1 k\Omega$$

The thickness of the p-zone in regions B is advisably selected to be greater than about 5 μm and less than about 50 μm; the doping concentration in this region of p-zone 2 advantageously has its maximum between about $3 \times 10^{15}/cm^3$ and $3 \times 10^{16}/cm^3$.

Figure 11:
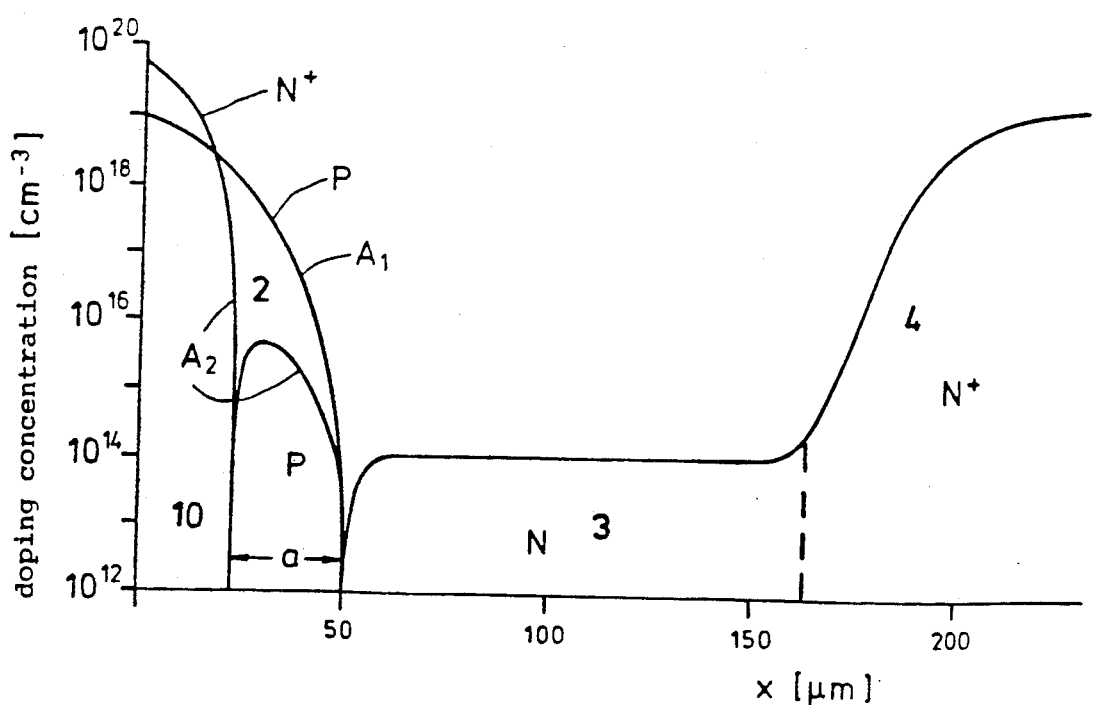
FIG. 11 are doping profiles of the zone structure of a rectifier diode configured according to FIG. 10.

An example of the doping curve of the rectifier diode according to FIG. 10 at section lines $A_1$, $A_2$ is shown in FIG. 11; the net doping curve is shown, i.e. the difference between acceptor and donor doping concentrations, taken as an absolute. At the surface p-zone 2 has a doping concentration along section line $A_1$ of $1 \times 10^{19}/cm^3$, in the region along section line $A_2$ ahead of n+-zones 10 the net doping has a maximum of $6 \times 10^{15}/cm^3$. The thickness of p-zone 2 is 50 μm, the thickness a of the projecting region is 27 μm. The n+-zones 10 have a net surface doping of $5 \times 10^{19}/cm^3$ and a thickness of 23 μm. The rectifier diode according to FIG. 10, which has the doping profile shown in FIG. 11, has the advantage that it can easily be produced according to known diffusion and marking [sic] methods. The surface concentration of p-zone 2 need not be set so small as that of zone 2a of the rectifier diodes according to FIGS. 3 and 6.

If the rectifier diode according to FIG. 10 is under a forward blocking load, the n+p junctions $J_3$ between n+-zone 10 and p-zone 2 are polarized in the forward direction. This forward polarization is produced by the drop in transverse voltage in the p-region projecting beyond n+-zones 10 in regions B by the reverse hole current flowing past n+-zones 10. In the stationary forward blocking state, the drop in transverse voltage and thus the forward polarization of n+p-junctions $J_3$ is low due to the low reverse current. However, when commutated from forward conduction, the forward polarization of n+p-junctions $J_3$ is higher during the recovery phase. The actuation of the npn-transistor formed of n+-zones 10, p-zone 2 and n-base zone 3 resulting therefrom may lead to a significant increase in the recovery current and additionally to breakdown of the npn-transistor and thus of the rectifier diode below its stationary forward blocking capacity. Both are avoided in that the distance between the space charge zone and n+p-junctions J₃ is selected to be sufficiently large under maximum forward blocking load and the lateral expanse of n+-zones 10 is selected to be sufficiently small. The distance of space charge zone R from n+-zones 10 initially influences, by way of the sheet resistance of the remaining neutral portion of p-zone 2 in regions B, the drop in transverse voltage and thus the magnitude of the forward polarization of n+p-junctions J₃. Moreover, this distance determines, by way of the gradient of the minority charge carrier concentration in the neutral portion of p-zone 2 in regions B, the electron current flowing from n+-zones 10 into space charge zone R at a given forward polarization. These dependencies are considered in the above determination of integral doping $N_{int}$ and of the sheet resistance $R_\square$ of the entire projecting p-zone 2 in regions B. If, for example, $N_{int}$ is selected to be $4\times 10^{12}/cm^2$, the neutral region still existing at the maximum reverse voltage still has approximately ⅔ of the sheet conductance of the entire p-zone 2 in regions B. However, with reverse currents of, for example, 100 A/cm², the sheet conductance of projecting p-zone 2 decisive for the forward polarization of n+p-junctions J₃ is noticeably increased by free charge carriers in a concentration of the order of magnitude of $10^{15}/cm^3$ in the space charge zone. Additionally, due to the lower injected charge carrier concentration, the reverse current in regions B is lower during the forward phase than in regions C of high emitter efficiency so that the lateral hole current in p-zone 2 in regions B is also reduced correspondingly. If the thickness w of n-base zone 3 is less than the radius $R_a$ of n+-zones 10, if the latter are configured like islands having a circular base face, only an edge zone of regions B with an expanse in the order of magnitude of the n-base thickness w contributes to the forward polarization of n+p-junctions J₃. The lowest of the two variables $R_a$ and w must not be greater than a length $L_0$ which is a reciprocal function of the occurring reverse current density and the sheet resistance of p-zone 2 in regions B. For rectifier diodes having a blocking capability above 1000 V, in which $w_n$ is greater than about 70 μm, $R_a$ is selected to be less than about 40 μm for typical sheet resistance values, under consideration of the reverse currents occurring in such a structure.

In the above statements, it is assumed that n+-zones 10 have a high emitter efficiency corresponding to the doping curves of FIG. 11. Although the surface doping concentration of these zones 10 should be high for good contactability, the emitter efficiency of n+p-junctions J₃ may also be set to be low by setting a small thickness for n+-zones 10. In this case, the lateral dimensions of n+-zones 10 may be selected to be larger.

As already described in detail for the rectifier diode according to FIG. 6, the electron sink S, whose area is disposed only in partial regions, results in an improved excess current behavior compared to the rectifier diode according to FIG. 3. Whether electron sink S is configured in the manner of an island and complementary region C of high emitter efficiency is contiguous or, as in the arrangement on which FIGS. 7 and 8 are based, regions C of high emitter efficiency are configured in the manner of islands and electron sink S forms a contiguous region or whether some other surface pattern is selected for the subdivision of the area into regions B and C is insignificant. For utilization of the edge effect described in connection with FIGS. 7 and 8, generally the lateral expanse of regions B, i.e. the maximum distance between the points of regions B and the closest electron sink, should be selected in such a manner that the hole injection averaged over the area is as small as possible at operating current densities, while at excess currents and in the case of large-area regions C, it takes on almost the saturation value.

Figure 12:
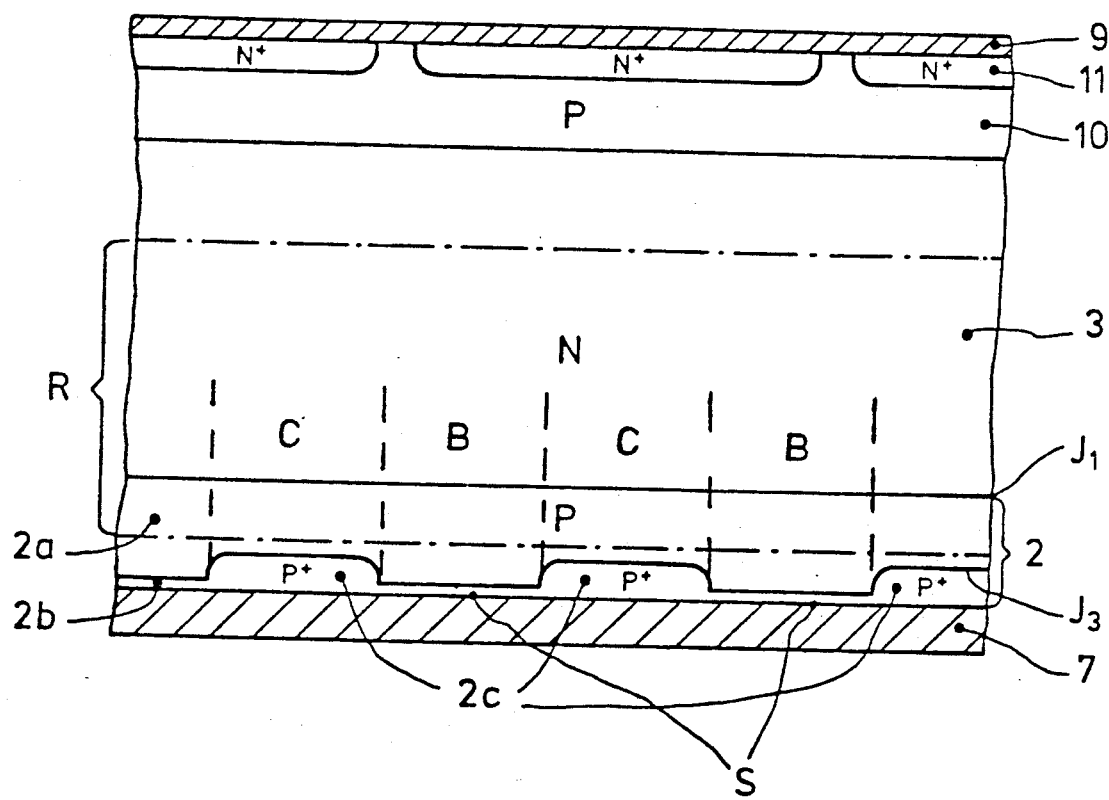
FIG. 12 shows the configuration of a thyristor according to the invention.

The use of the above-described p-emitter structures with an electron sink S in a thyristor is shown in FIG. 12. As in the rectifier diode according to FIG. 6, p-zone 2 on the anode side is composed of a continuous, weakly doped partial zone 2a, a thin, highly doped p+-type partial zone 2b in regions B, which in these regions serves for contacting, and relatively thick, highly doped p+-type partial zones 2c of high emitter efficiency in regions C. At the surface, p-zone 2 is provided with a continuous contacting layer 7. Toward the interior, p-zone 2 is followed by the weakly doped n-base zone 3 which is followed, as in a conventional thyristor structure, by the p-conductive control base zone 10 and the n-conductive emitter zone 11 on the cathode side, which are provided with a contacting layer 9 on the surface. The dimensions of p-zone 2 may be selected according to the statements made in conjunction with FIGS. 7 and 8.

As shown for the above-described rectifier diodes in FIG. 9, p-zone 2 produces a charge carrier concentration in the thyristor structure which at operational forward current densities (200 A/cm²) drops toward p-zone 2. As described in connection with FIG. 1, this results, for a thyristor as well, in a reduction of the reverse current peak and of the reverse current integral after commutation. Due to the injection capability of p-zone 2 increasing with the forward current (FIGS. 7 to 9), the permissible excess current is not reduced. In addition to the statements made in conjunction with FIGS. 7 and 8, the dimensioning of the p-zone in the thyristor must also consider that the firing and latching currents of the thyristor must not be increased beyond given limits. This can be effected by a lower additional recombination center density or by raising the surface concentration of p-type partial zone 2a compared to the rectifier diode.

We claim:

1. Semiconductor component having a weakly doped continuous interior p-zone which is provided on its surface with an ohmic contact layer, a weakly doped n-base zone adjacent to said weakly doped p-zone, a highly doped n+-zone arranged adjacent to said n-base zone, and a plurality of p+-surface zones arranged entirely within partial regions of said weakly doped p-zone.

2. Semiconductor component according to claim 1, wherein the highly doped p+-surface zones are of high emitter efficiency.

3. Semiconductor component according to claim 2, wherein the highly doped p+-surface zones have a circular base region having a radius of between 30 μm and 100 μm.

4. Semiconductor component according to claim 1, wherein the weakly doped p-zone is provided at said surface with a highly doped p+-surface layer which serves to provide contact.

5. Semiconductor component according to claim 4, wherein the p+-surface layer is of low emitter efficiency.

6. Semiconductor component according to claim 4, wherein the thickness of the surface layer is less than 2 μm and its maximum doping concentration is greater than $3 \times 10^{17}/cm^3$.

7. Semiconductor component according to claim 1, wherein the integral net doping ($N_{int}$) of the weakly doped continuous interior p-zone is between $1.3 \times 10^{12}/cm^2$ and $2 \times 10^{13}/cm^2$.

8. Semiconductor component according to claim 1, wherein the thickness of the weakly doped continuous interior p-zone is between 5 and 70 μm and the maximal doping concentration is between $1 \times 10^{15}$ and $2 \times 10^{16}/cm^3$.

9. A semiconductor component comprising: a monocrystalline semiconductor body including at least a first continuous weakly doped p-layer at one outer surface of said body, a second weakly doped n-layer adjacent to and forming a pn-junction with said weakly doped p-layer, a highly doped n+-layer adjacent to said n-base layer, and a plurality of highly doped p+-zones formed entirely within said weakly doped p-layer at said outer surface of said semiconductor body; an ohmic contact layer disposed on said outer surface of said semiconductor body and contacting said p-layer and said p+-zones; and a contact for said n+-layer.

10. A semiconductor component according to claim 9 wherein said highly doped p+-zones have a high emitter efficiency.

11. A semiconductor component according to claim 10 wherein said highly doped p+-zones each have a circular base region with a radius of between 30 μm and 100 μm.

12. A semiconductor component according to claim 11 wherein said weakly doped p-layer has a thickness between 5 and 70 μm and a maximum doping concentration between $1 \times 10^{15}$ and $2 \times 10^{16}/cm^3$.

13. A semiconductor component according to claim 12 wherein the integral net doping ($N_{int}$) of said weakly doped p-layer is between $1.3 \times 10^{12}/cm^2$ and $2 \times 10^{13}/cm^2$.

14. A semiconductor component according to claim 12 further comprising a highly doped p+-contact layer provided in and covering said weakly doped p-layer at said outer surface of said semiconductor body to provide contact to said ohmic contact layer, said p+-contact layer being thinner than said p+-zones.

15. A semiconductor component according to claim 14 wherein said p+-contact layer has a low emitter efficiency.

16. A semiconductor component according to claim 15 wherein said contact layer has a thickness less than 2 μm and a maximum doping concentration which is greater than $3 \times 10^{17}/cm^3$.

17. A semiconductor component according to claim 9 further comprising a highly doped p+-contact layer provided in and covering said weakly doped p-layer at said outer surface of said semiconductor body to provide contact to said ohmic contact layer, said p+-contact layer being thinner than said p+-zones.

18. A semiconductor component according to claim 17 wherein said p+-contact layer has a low emitter efficiency.

19. A semiconductor component according to claim 18 wherein said p+-contact layer has a thickness less than 2 μm and a maximum doping concentration which is greater than $3 \times 10^{17}/cm^3$.

20. A semiconductor component according to claim 9 wherein said weakly doped p-layer has a thickness between 5 and 70 μm and a maximum doping concentration between $1 \times 10^{15}$ and $2 \times 10^{16}/cm^3$.

* * * * *